(12) United States Patent
Strauch (10) Patent No.: US 6,670,216 B2
(45) Date of Patent: Dec. 30, 2003

(54) METHOD FOR MANUFACTURING A POWER SEMICONDUCTOR DEVICE AND DIRECT BONDED SUBSTRATE THEREOF

(75) Inventor: Gerhard Strauch, Buerstadt (DE)

(73) Assignee: Ixys Corporation, Santa Clara, CA (US)

( * ) Notice: Subject to any disclaimer, the term of this patent is extended or adjusted under 35 U.S.C. 154(b) by 0 days.

(21) Appl. No.: 10/283,829

(22) Filed: Oct. 29, 2002

(65) Prior Publication Data

US 2003/0096450 A1 May 22, 2003

Related U.S. Application Data

(60) Provisional application No. 60/334,986, filed on Oct. 31, 2001.

(51) Int. Cl.[7] .................. H01L 21/44; H01L 21/48; H01L 21/50
(52) U.S. Cl. ................................. 438/106; 438/122
(58) Field of Search ............................ 438/106, 107, 438/110, 118, 119, 122, 112

(56) References Cited

U.S. PATENT DOCUMENTS 5,917,157 A * 6/1999 Remsburg

* cited by examiner

Primary Examiner—Phuc T. Dang
(74) Attorney, Agent, or Firm—Townsend and Townsend and Crew LLP (57) ABSTRACT

Embodiments of the present invention are directed to packaged power semiconductor devices and direct-bonded metal substrates thereof. In one embodiment, a method for manufacturing a power semiconductor device comprises inserting a substrate assembly into a furnace having a plurality of process zones. The substrate assembly includes a first aluminum layer and a second aluminum layer that are electrically isolated from each other by a dielectric layer. The method further comprises providing the substrate assembly successively into each of the plurality of process zones to bond the first and second aluminum layers to the dielectric layer and obtain a direct bonded aluminum (DAB) substrate, attaching a semiconductor die to the first aluminum layer of the DAB substrate, and forming an enclosure around the semiconductor die and the DAB substrate while exposing a substantial portion of the second aluminum layer for enhanced heat dissipation.

17 Claims, 7 Drawing Sheets

| | thickn. | weight |
|---|---|---|
| top boat | 10 mm | 270 g |
| bottom boat | 5 mm | 130g |

METHOD FOR MANUFACTURING A POWER SEMICONDUCTOR DEVICE AND DIRECT BONDED SUBSTRATE THEREOF

CROSS-REFERENCES TO RELATED APPLICATIONS

This application claims priority to U.S. Provisional Patent Application No. 60/334,986, filed on Oct. 31, 2001, which is incorporated by reference herein for all purposes.

BACKGROUND OF THE INVENTION

This invention relates to electronic devices and components thereof, and more particularly to packaged power semiconductor devices and direct-bonded metal substrates thereof.

Power semiconductor devices or power devices are designed to operate at relatively high voltages, typically 30–1,000 volts or higher. Many power devices, such as, silicon-controlled rectifiers ("SCRs"), power transistors, insulated-gate bipolar transistors ("IGBTs"), metal-oxide-semiconductor field-effect transistors ("MOSFETs"), power rectifier, power regulators, or combinations thereof, are assembled in packages that are not electrically isolated. That is, a metal tab, which typically forms the backside of the packaged device, is electrically coupled, e.g. soldered, to the semiconductor die within the packaged device. This places the backside of the package at the same electrical potential as the semiconductor die. Additionally, the power semiconductor device may be exposed to voltages outside of the intended range during operation, which may electrically couple to the backside of the package.

The high voltages present at the backside of conventional packaged power semiconductor devices may damage other circuit components or may present a safety hazard to a person operating equipment built with these devices. Voltages as low as 40 Volts can be a hazard to operators working with or on such equipment. Insulating pads or washers are typically used to electrically isolate the backside of the power semiconductor device from the rest of the circuit. In a typical application, the power semiconductor is mounted on a heatsink that is part of an electrical chassis at ground potential.

Heatsinking is important for power semiconductor devices because of the power dissipated by some devices during operation, and also because of the environment that the device may have to operate in. Power semiconductor devices are often used in applications that may get relatively hot, such as in an engine compartment or in a factory. Thus, it is especially important to minimize the thermal resistance between the active device, which may be generating several Watts or even several kilowatts of power, and the environment, which may be at an elevated temperature.

Accordingly, a power semiconductor device preferably should have good thermal conductivity and reliable electrical isolation between the backside of the packaged power device and the semiconductor. One method used to provide such a power device is to manufacture a power device on a substrate having two conductive layers separated by a dielectric layer.

BRIEF SUMMARY OF THE INVENTION

Embodiments of the present invention are directed to packaged power semiconductor devices and direct-bonded metal substrates thereof.

In accordance with an aspect of the present invention, a method for manufacturing a power semiconductor device comprises inserting a substrate assembly into a furnace having a plurality of process zones. The substrate assembly includes a first aluminum layer and a second aluminum layer that are electrically isolated from each other by a dielectric layer. The method further comprises providing the substrate assembly successively into each of the plurality of process zones to bond the first and second aluminum layers to the dielectric layer and obtain a direct bonded aluminum (DAB) substrate, attaching a semiconductor die to the first aluminum layer of the DAB substrate, and forming an enclosure around the semiconductor die and the DAB substrate while exposing a substantial portion of the second aluminum layer for enhanced heat dissipation.

In some embodiments, the second aluminum layer is flushed to a backside of the enclosure. The plurality of process zones include a preheating zone, a bonding zone, and a cooling zone, wherein the bonding zone is provided with an inert gas to facilitate the bonding of the aluminum layers to the dielectric layer without providing a vacuum environment. The method may comprise shaping an edge of at least one of the aluminum layers to enhance stress-handling characteristics of the DAB substrate. See "Products-Features-Dimples (Stress relief)" at http://www.curamik.de. The shaping step may be performed prior to the bonding of the at least one of the aluminum layers to the dielectric layer. The shaping may be performed on all outer edges of the at least one of the aluminum layers. The shaping step may include providing a slope to the edge of the at least one of the aluminum layers (the slope has an angle of about 30 degrees to about 60 degrees), and forming a plurality of notches, holes, or grooves on the edge of the at least one of the aluminum layers. The first aluminum layer and the second aluminum layer each may be coated by an Al—Si alloy or an Al—Mg alloy opposing to the dielectric layer. The combination of, e.g. Al and Si, typically occurs under high pressure in a cladding roll stand.

In accordance with another aspect of the invention, a method for forming a direct bonded metal substrate for use in a power semiconductor device comprises inserting a substrate assembly into a furnace having a plurality of process zones. The substrate assembly includes a first aluminum substrate and a second aluminum substrate that are electrically isolated from each other by a dielectric substrate. The method further comprises providing the substrate assembly successively into each of the plurality of process zones to bond the first and second aluminum substrates to the dielectric substrate at the same time, thereby obtaining a direct bonded aluminum (DAB) substrate.

In some embodiments, the method may further comprise placing a top boat over the substrate assembly to apply a pressure to facilitate the bonding of at least the first aluminum substrate to the dielectric substrate, and providing a bottom boat below the substrate assembly, wherein the top boat is heavier than the bottom boat.

In accordance with another aspect of the invention, a power semiconductor device comprises a direct bonded metal substrate having first and second conductive layers separated by a dielectric layer. The second conductive layer has edges that are shaped to enhance stress-handling characteristics. A semiconductor die is bonded to the first conductive layer. A plastic package is formed around the semiconductor die and the first conductive layer while exposing a substantial portion of the second conductive layer. The second conductive layer is flushed to a backside of the plastic package.

In some embodiments, the edges of the second conductive layer are provided with a slope of about 30–60 degrees to enhance the stress-handling characteristics. The edges of the second conductive layer are provided with a plurality of notches, holes, grooves, or a combination thereof to enhance the stress-handling characteristics.

In accordance with yet another aspect of the present invention, a direct bonded metal substrate for use in a power semiconductor device comprises a first conductive layer, a second conductive layer, and a dielectric layer provided between the first and second conductive layer and being eutectically bonded with the first and second conductive layers. The edges of the first conductive layer are provided with geometric shapes to enhance stress-handling characteristics of the direct bonded metal substrate.

DETAILED DESCRIPTION OF THE INVENTION

Embodiments of the present invention relates to a direct bonded metal substrate, e.g., direct bonded aluminum substrate, and a power semiconductor device using a direct bonded metal substrate, thereby providing a simplified construction of a power device for mass production, reduced costs, reduced thermal fatigue problem associated with multilayered packages, reduced thermal resistance of the package, reduced thermal fatigue effect, and the like. The embodiments are described using a radio frequency (RF) power semiconductor device. However, the direct bonded metal substrates may be used in other types of power devices, e.g., TO-247, TO-220, TO-264, or SOT-227B standard devices. These standards are configurations as defined by the Joint Electronic Device Engineering Council ("JEDEC").

The direct bonded aluminum substrate is also referred to as direct aluminum bonded ("DAB") substrates. As used herein, the term "direct bonded aluminum" or "DAB" substrate refers to a substrate comprising a dielectric layer and an aluminum layer (conductive layer) bonded to each other by heating them to a temperature between the eutectic and melting temperatures of the aluminum layer. The aluminum layer may be substantially pure aluminum or aluminum alloy, or a combination thereof. The dielectric layer may be aluminum nitride, alumina, or other ceramic materials that are not conductive materials. In one embodiment, the direct bonded aluminum (DAB) substrate has two aluminum layers with a dielectric layer provided therebetween. A more detail description of the direct bonded metal substrate will be provided later.

As used herein, the term "high frequency RF device" or "high frequency RF power device" refers to RF power device operating at or above 50 MHz, preferably over 80 MHz. Generally, a high frequency RF device is provided with leads having blade-like shapes to handle the "skin effect," described below. Generally, the high frequency RF power device operates at high voltages (e.g., $V_{DS}$ of 500 V or greater) and outputs high power (e.g., 300 Watts or greater).

Figure 1:
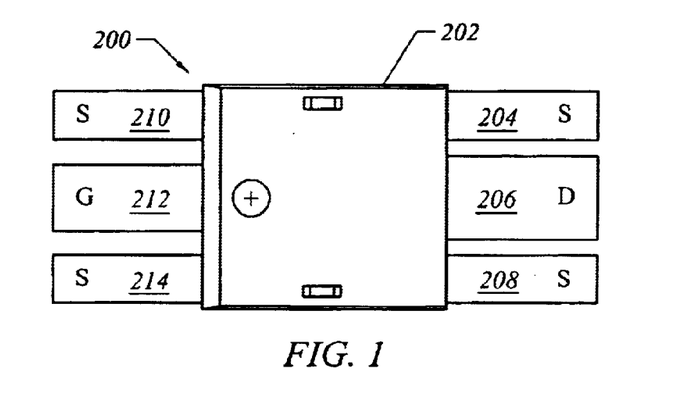
FIG. 1 illustrates a top plan view of a high frequency RF power device according to one embodiment of the present invention.
Figure 2:
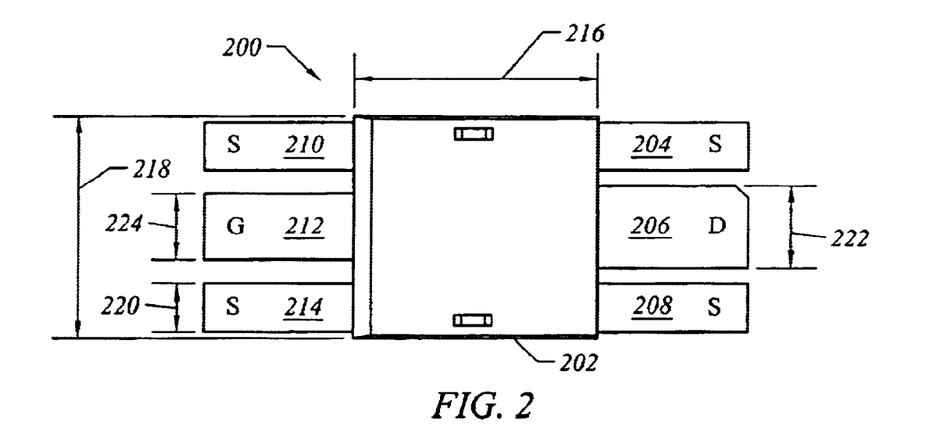
FIG. 2 illustrates a top plan view of a high frequency RF power device with dimensions according to one embodiment of the present invention.
Figure 3:
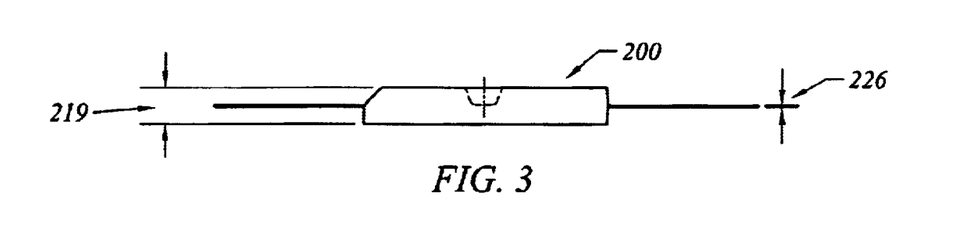
FIG. 3 illustrates a cross sectional view of a high frequency RF power device according to one embodiment of the present invention.

FIGS. 1–3 illustrate a high frequency RF power device 200 having a plastic package 202 and a DAB substrate (not shown) according to one embodiment of the present invention. The power device 200 is a discrete device having a single semiconductor die according to one implementation. The device 200 includes the plastic package 202 and a plurality of leads 204–214 having blade-like shapes with the leads extending outwardly from opposing sides of the package. The leads are configured to be wide and thin due to the "skin effect" in high frequency current. At high frequencies (e.g., over 50 MHz) a substantial amount of the electrical current flows in outer edges (or skin) of the conductor. The magnetic fields generated by the alternating current tend to push the current towards the outside of the conductor. The current squeezes more and more tightly against the surface of the conductor at higher and higher frequencies. As used herein, the term "tape-like shape" or "blade-like shape" describes an object having a width that is significantly greater than its thickness to handle the skin effect.

In one embodiment, the device 200 is designed to operate at 400 to 1500 volts ($V_{DS}$), generate current ($I_{DS}$) of 5 to 15 amperes, and output of 250 to 1000 Watts. The device 200 is design to operate at frequencies up to 100 MHz in one implementation, or up to 200 MHz in another implementation, or greater in yet another implementation. In one embodiment, the device 200 is a discrete device having a single semiconductor die enclosed within the package having a main surface area of about 0.2 to 1 square inch (130 to 645 mm$^2$).

Referring to FIGS. 2 and 3, the dimensions of the device 200 vary according to different embodiments of the present invention. For example, the package 202 has a length 216 ranging from about 0.5 to 1 inch (12.7 to 25.4 mm) and a width 218 ranging from about 0.5 to 1 inch (12.7 to 25.4 mm). The package has a thickness 219 ranging from 0.1 to 0.15 inch (2.54 to 3.81 mm). In the present embodiment, the package 202 has a length 216 of about 0.91 inch (23.1 mm), a width 218 of about 0.83 inch (21.1 mm) and a thickness 219 of about 0.125 inch (3.175 mm).

The device includes three types of leads, all having blade-like shapes in one embodiment of the present invention. The leads of first type, the leads 204, 208, 210, and 214, are coupled to source regions of the semiconductor die (not shown) within the package 202. Each lead has a width 220 ranging from about 0.1 to 0.17 inch (2.54 to 4.32 mm). The lead of second type, the lead 206, is coupled to a drain region and has a width 222 ranging from about 0.125 to 0.346 inch (3.175 to 8.79 mm). The lead of third type, the lead 212, is coupled to a gate and has a width 224 ranging from about 0.085 to 0.306 inch (2.16 to 7.77 mm). These leads 204–214 generally have a thickness 226 ranging from about 0.001 to 0.015 inch (0.025 to 0.38 mm). In one embodiment, the leads 204, 208, 210, and 214 have the width 220 of about 0.162 inch (4.115 mm). The lead 206 has the width 222 of about 0.346 inch (8.79 mm). The lead 212 has the width 224 of about 0.306 inch (7.77 mm). All of these leads have substantially the same thickness 226 of about 0.006 inch (0.152 mm). Accordingly, in this embodiment, the ratio of width to thickness for the leads 204, 208, 210, and 214 with the smallest width is 27, i.e., the width is 27 times greater than the thickness. In other embodiments, the ratio of width to thickness is greater (e.g., 30, 35, or 40) or smaller (e.g., 20, 15, or 10) than 27.

Figure 4A:
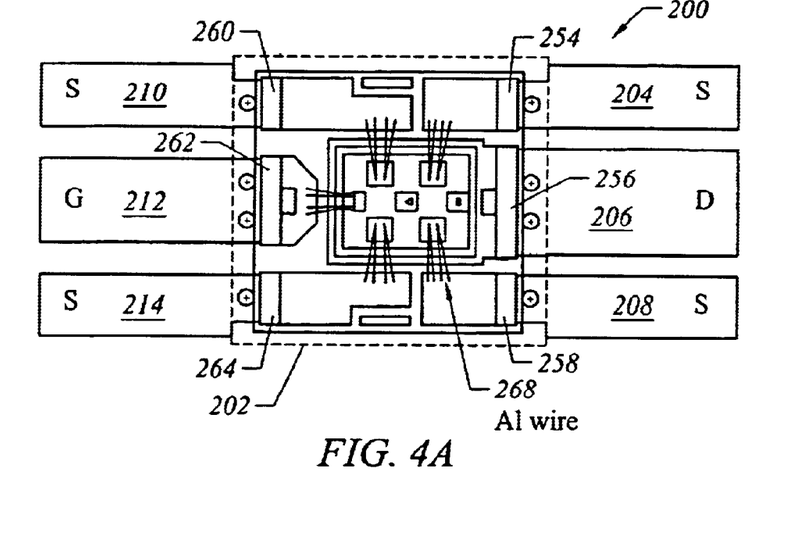
FIG. 4A illustrates a top plan view of a high frequency RF power device with the plastic package delayered according to one embodiment of the present invention.
Figure 4B:
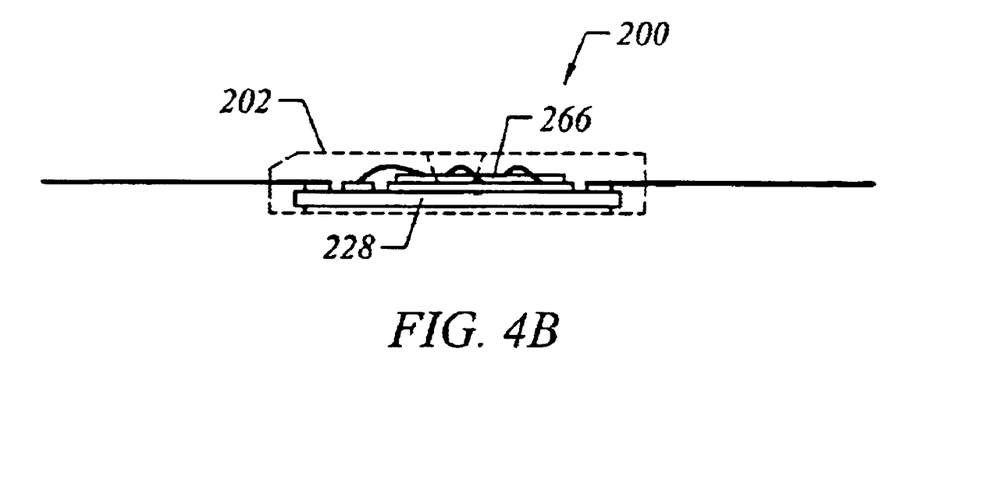
FIG. 4B illustrates a cross sectional view of a high frequency RF power device with the plastic package delayered according to one embodiment of the present invention.
Figure 5:
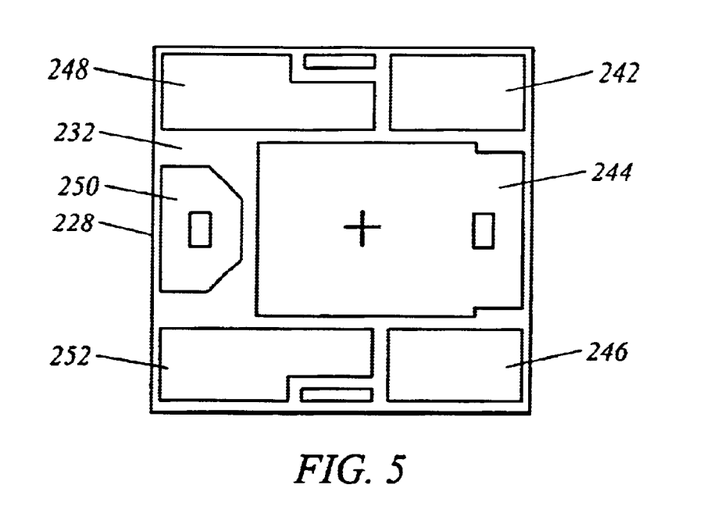
FIG. 5 illustrates a top plan view of a direct bonded metal substrate according to one embodiment of the present invention.
Figure 6:
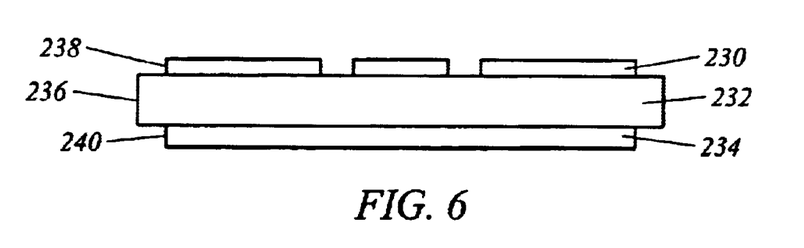
FIG. 6 illustrates a cross sectional view of a direct bonded metal substrate according to one embodiment of the present invention.

FIG. 4A depicts a top plan view of the device 200 with the plastic package 202 delayered as indicated by the dotted line. FIG. 4B depicts a cross sectional view of the device 200 with the plastic package 202 delayered as indicated by the dotted line. As shown, in FIG. 4B, the backside of the package 202 is flushed to the backside of a DAB substrate according to one embodiment of the present invention. FIG. 5 depicts a top plan view of a direct bonded aluminum (DAB) substrate 228 of the device 200, and FIG. 6 depicts a cross sectional view of the DAB substrate 228, according to one embodiment of the present invention. The DAB substrate 228 has a first conductive or aluminum (front side) layer 230 that is bonded to a second dielectric layer 232, typically of ceramic material, that is in turn bonded to a third conductive or aluminum (backside) layer 234 (FIG. 6). The dielectric layer 232 generally has an outer edge 236, which extends beyond outer edges 238 and 240 of the first and third conductive layers, to provide better electrical isolation of the two conductive layers. The DAB substrates provide superior thermal conductivity due to its "eutectic bond" between the conductive layers and the dielectric layer.

In the present embodiment, the dielectric layer 232 is alumina. The dielectric layer could be other material, such as aluminum nitride, beryllia (BeO), or other insulating material compatible with direct bonded aluminum substrate fabrication method provided below.

The first aluminum layer 230 is patterned to have a plurality of conductive islands or blocks 242–252 that are separated by the ceramic layer 232 provided below the layer 230 (FIG. 5). Referring to FIG. 4, a bonding portion 254 of the lead 204 is bonded to the block 242; a bonding portion 256 of the lead 206 is bonded to the block 244; a bonding portion 258 is bonded to the block 246; a bonding portion 260 of the lead 210 is bonded to the block 248; a bonding portion 262 of the lead 212 is bonded to the block 250; and a bonding portion 264 of the lead 214 is bonded to the block 252. These bonding portions of the leads are soldered to the respective blocks of the first aluminum layer 230. A semiconductor die 266 with one or more transistors defined thereon is bonded to the block 244. Various conductive regions, such as, gate, source, and drain regions, are electrically coupled to the leads via wires 268 extending from the die to the leads. In one embodiment, the wires 268 are aluminum wires but other conductive wires may be used. Bonding the leads to the blocks of the first aluminum layer 230, as shown in FIG. 4, facilitates manufacturing of a plurality of the devices 200 in a single assembly process.

The power device 200 with a DAB substrate 228 tends to provide greater structural integrity. The substrate or pad, on which the semiconductor die is provided, is less likely to crack because the composite DAB structure provides support for the ceramic layer.

The backside aluminum layer 234 also improves the thermal performance of the power device 200. The temperature in the vicinity of the die ("underneath" the die) tends to be higher than the temperature at the edge of the ceramic layer 232. Although the extent of this heat gradient depends on many factors, the backside aluminum layer 234 effectively spreads the heat across the entire ceramic layer, thereby reducing the formation of a hot-spot underneath the die. More effective heat distribution also reduces heat-related stress and resultant cracking of the substrate and/or die, thus improving reliability.

Figure 7:
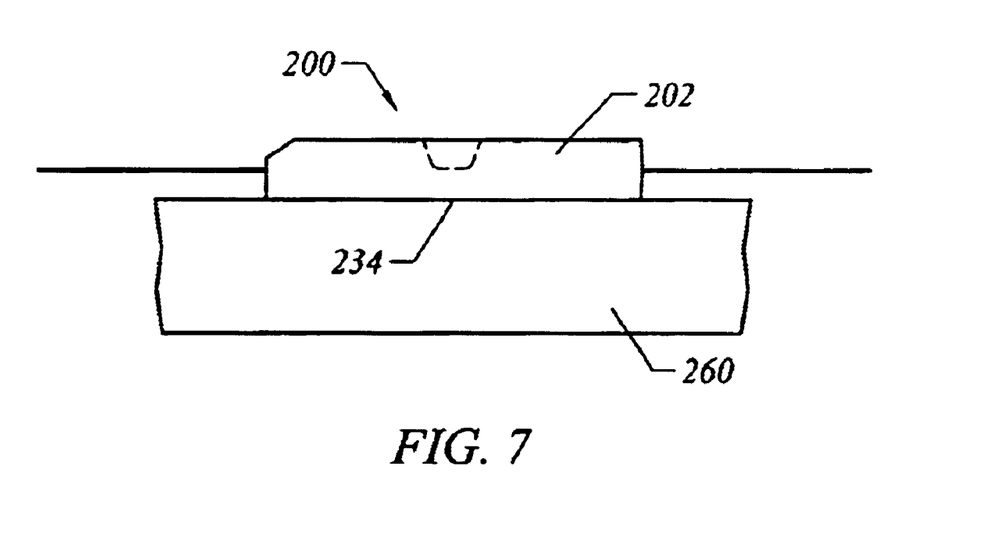
FIG. 7 illustrates a cross sectional view of a high frequency RF device coupled to a heatsink according to one embodiment of the present invention.

Additionally, the direct-bonding process, described below, intimately attaches the aluminum to the ceramic (i.e., creates a "eutectic bond" between the aluminum and ceramic) and provides excellent thermal conduction from one layer to the other. This thermal conduction provided by the aluminum layer 234 is better than that typically provided by contacting a bare ceramic substrate to a heatsink. Moreover, the backside aluminum layer allows the RF power device 200 to be soldered to a heatsink, thermally coupling the entire area of the backside layer to a heatsink 260, as shown in FIG. 7.

In one conventional technique, the power device 200 includes a direct bonded copper (DCB) substrate rather than a direct bonded aluminum substrate. Such a DCB substrate generally is provided with an aluminum-based ceramic as the dielectric layer that is bonded to two conductive (or copper) layers in a controlled oxidizing ambient. The DCB substrate has good thermal conductivity, good voltage isolation between the metal layers, good thermal ruggedness (the material keeps its properties over a wider temperature range than polymer based or glued metallic substrates like PCB and IMS), and similar thermal expansion coefficient as that of silicon or other semiconductor materials.

However, the DCB substrate has limited power cycling capabilities although power semiconductor devices including DCB substrate have longer thermal cycling or power cycling capabilities than power semiconductor devices that are attached to a metal header or heatsink directly. Power and thermal cycling capabilities are basically the number of cycles that a device can pass without failures in the structure due to thermal fatigue, corrosion or any other temperature and expansion coefficient mismatch effect.

In thermal cycling, a power semiconductor is subjected to cycles repeated between a low temperature state to a high temperature state without powering the device on. In power cycling the said power device is powered on and off, and its thermal excursion between these states is due to its self-heating. At times a combined thermal and power cycling is performed on the devices to test their reliability in accelerated testing. Often in real operation in some applications, the power devices are subjected to such cycles in any combinations. For example, in automotive applications, the temperature operating range can be from −55 C. to +150 C. In some other applications the temperature range can be even more severe while power is being applied to the device.

Under such extreme circumstances, the power devices having DCB substrates have demonstrated structural failures. A variety of cracks start to form in the bonded areas between the copper and the ceramic layers, which propagate with each successive power cycle or thermal cycle, or both. At times micro-cracks are formed on the DCB substrate even during its manufacturing process, e.g., during a cooling period of the DCB substrate after a high temperature manufacturing step. These cracks lead to the structural and eventual electrical failure of such power devices in said applications.

One solution to the above crack formation problem is to use a different bonded substrate technology, e.g., using an aluminum layer rather than a copper layer. The manufacturing process of the DAB substrate has to be customized due to the unique metallurgical and surface qualities of aluminum (Al). One process method used for manufacturing the DAB substrate involves performing the bonding a vacuum environment, requiring a two-step bonding process. The upper and lower aluminum layers are bonded to the dielectric layer in separate bonding steps. These two steps require at least two operations of breaking the vacuum in a suitable vacuum oven and then re-establishing the vacuum, before exposing the material for bonding in a high temperature process. Accordingly, the production output per hour is thus reduced when compared to a belt furnace operation, which provides a continuous bonding process. More detailed descriptions of the belt furnace operation used in manufacturing a direct bonded metal substrate can be found in, for example, EP 422,558, and U.S. Pat. No. 4,483,810, which are incorporated herein by reference for all purposes.

Figure 8:
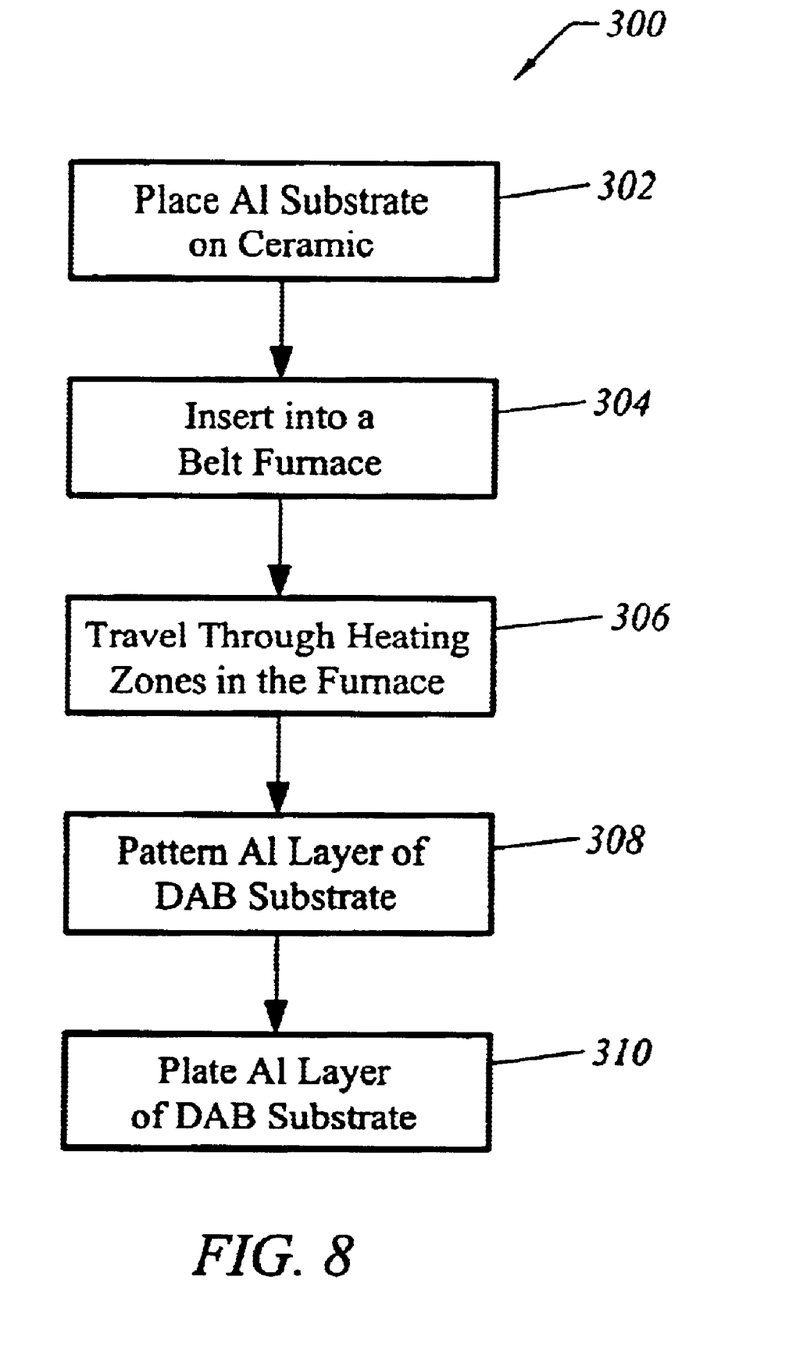
FIG. 8 illustrates a process of manufacturing a direct bonded substrate according to one embodiment of the present invention.
Figure 9:
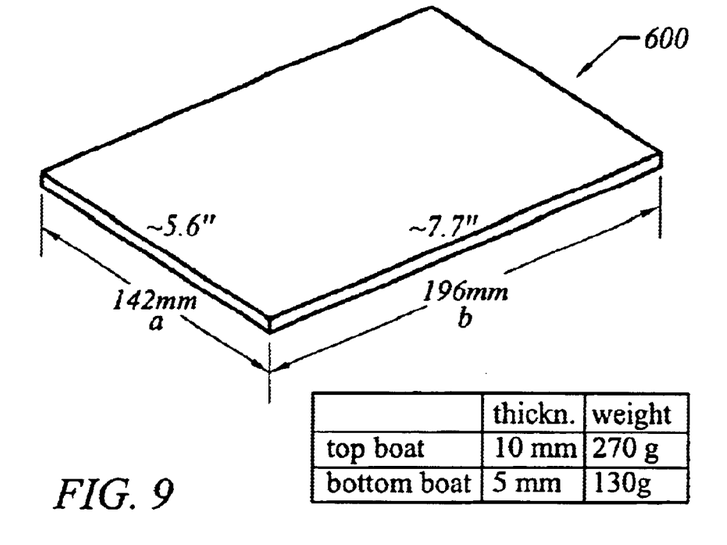
FIG. 9 illustrates a carrier whereon a substrate assembly is placed for furnace bonding process according to one embodiment of the present invention.
Figure 10:
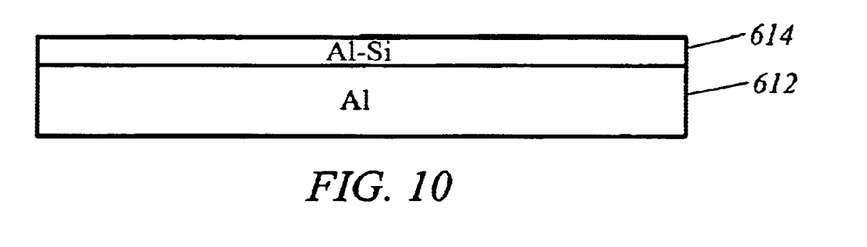
FIG. 10 illustrates a schematic cross-sectional view of an aluminum substrate having an aluminum-silicon alloy according to one embodiment of the present invention.

Referring to FIGS. 8, 9, and 10, a method 300 for forming the direct bonded aluminum substrate 228 involves using a belt furnace operation according to one embodiment of the present invention. An aluminum substrate is placed on a dielectric or ceramic substrate (step 302). In one embodiment, two aluminum substrates are placed on opposing sides of the ceramic substrate to form a three-layer substrate. The aluminum and ceramic substrates are placed on a carrier 600, preferably of material (e.g., graphite or silicon carbide) that does not react easily with the substrates (FIG. 9), as described in more detail later. The assembled aluminum and ceramic substrates on the carrier 600 (referred to hereinafter as "the substrate assembly") are inserted into a belt furnace for bonding (step 304). One example of the furnace is disclosed in U.S. Pat. No. 4,483,810.

The Al plate has a layer of an Al—Si alloy on one of its sides that is to be bonded to the ceramic or dielectric substrate. In one embodiment, the Al—Si alloy has a Si concentration of less than about 15%, preferably less than about 11.7%, and more preferably less than about 8%. In one embodiment, the Si concentration is about 7.5% or 6.5%. The Al—Si layer has a lower melting point than pure Al, thereby enabling the bonding process to be conducted in a lower temperature. The thickness of the Al—Si alloy layer, provided on the Al "carrier" plate, is preferably less than about 70 $\mu$m, or preferably less than about 50 $\mu$m according to one embodiment of the present invention. The total thickness of the aluminum plate including the Al—Si alloy is between about 150 $\mu$m and about 700 $\mu$m, or preferably between about 200 $\mu$m and about 500 $\mu$m. FIG. 10 shows an exemplary aluminum plate 612 having an Al—Si alloy layer 614 that is described above.

At step 306, the aluminum and ceramic substrates travels along one or more heating zones to be bonded. Generally, there are at least three heating zones in the furnace: (1) a preheating zone to gradually ramp up the temperature of the substrate assembly, (2) a primary heating zone to bring the substrate assembly to a temperature between eutectic and melting temperature of aluminum, and (3) a cooling zone to gradually cool the substrate assembly and solidify the eutectic melt. The solidification of the eutectic melt does not occur instantaneously, and the bonding process is not completed until the temperature drops well below the eutectic temperature. The cooling process generally involves two or more steps to gradually ramp down the temperature during a period of about 15 minutes or more according to one embodiment of the present invention. Accordingly, the cooling zone may include two or more sub-zones according to one embodiment of the present invention. Other heating zones may includes two or more sub-zones as well.

An inert gas (e.g., nitrogen) is flowed into the heating and cooling zones of the furnace to provide an inert atmosphere during the bonding process, thereby eliminating the need to provide a vacuum environment which increases manufacturing cost. Other gases are not present or are <<1 ppm.

The belt furnace provides a continuous flow process where the substrate assembly travels on a metal conveyer belt of the furnace from one heating zone to another. In such a process, each substrate experiences the same heating zone and same temperature profile in contrast to a process involving separate bonding steps for the upper and lower aluminum layers. Accordingly, the belt furnace process provides a high throughput and requires less manufacturing cost.

Figure 11:
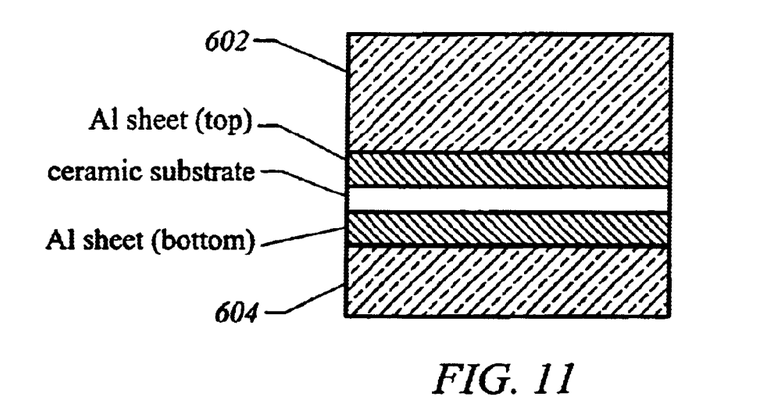
FIG. 11 illustrates a schematic cross-sectional view of a substrate assembly including first and second aluminum substrates separated by a dielectric substrate according to one embodiment of the present invention.

In addition, one or more weights are used to facilitate the bonding between the aluminum and ceramic substrates. In one embodiment, two weights are used, a top boat 602 and a bottom boat 604 (FIG. 11), together they comprise the carrier 600 described above. The top boat 602 is placed on the upper aluminum substrate to apply a pressure to facilitate bonding, and the bottom boat 604 is placed below the lower aluminum substrate to isolate the bottom aluminum substrate from the metal belt of the furnace. The bottom boat preferably is made of material that has relatively good thermal conductivity, relatively low mass and low thermal capacity. In one embodiment, the top and bottom boats are made of the same material, such as graphite or other materials that have similar properties to graphite and do not easily interact chemically with the aluminum substrate or the metal alloys of the furnace belt.

Figure 13:
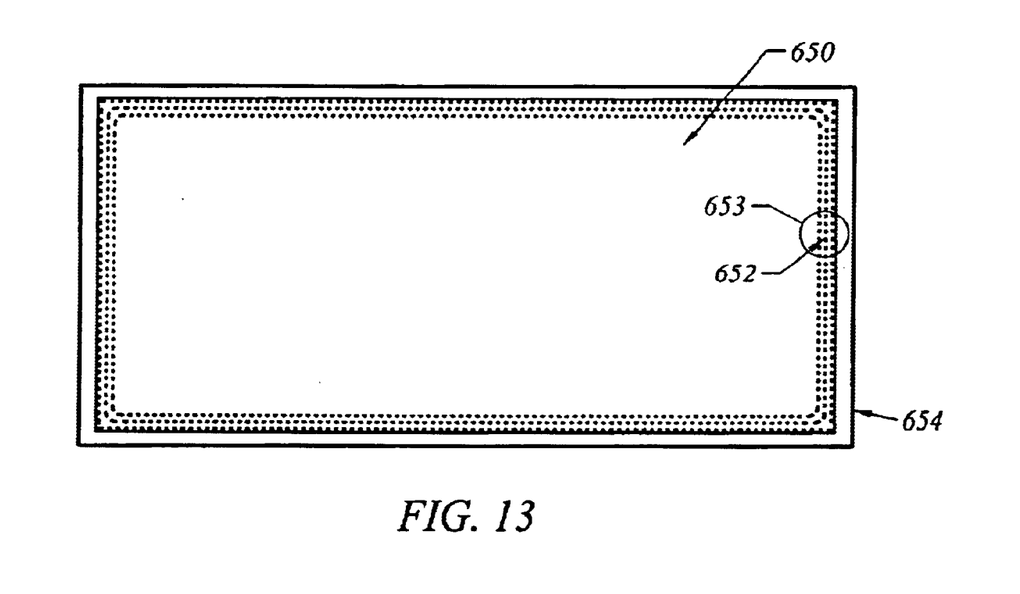
FIG. 13 illustrates a top view of a direct bonded metal substrate having edges that are shaped to provide enhanced stress-handling characteristics according to one embodiment of the present invention.

Referring back to FIG. 9, the top boat 602 and the bottom boat 604 have substantially the same width a and length b according to one embodiment of the present invention. The width a is 5.6" and the length b is 7.7" in order to fit on ceramic and corresponding Al—AlSi plates of same or similar size. Since the Al metal is relatively light, the top boat 602 weights more than the bottom boat 604 according to one embodiment. Generally to reduce the overall heat mass of the boats, it is preferable to use a boat of lighter weight to achieve a fast throughput and efficient bonding process but sufficiently heavy enough to apply the desired downward pressure on the aluminum substrate to facilitate bonding. Accordingly, the top boat 602 preferably weights more than the bottom boat 604. In the present embodiment, the top boat weights 490 g and has a thickness of about 10 mm, and the bottom boat 604 weights 245 g and has a thickness of about 5 mm. FIG. 13 illustrates the substrate assembly as it is aligned and conveyed on the belt through the furnace for bonding.

One advantage of using graphite as a material for the boats is its ability to "getter" any traces of oxygen in the ambient above and around said belt in the furnace, especially through its "hot zones", and thus preventing the oxidation of the Al and AlSi alloy. Any such oxidation hinders proper bonding of the Al—AlSi substrate to the ceramic substrate. Additionally, the top and bottom graphite boats act also as good heat spreaders spreading the heat in the furnace evenly over the surfaces of the substrate assembly due to graphite's superior thermal conductivity.

Referring back to FIG. 8, the method 300 further includes patterning the top aluminum substrate of the bonded substrate assembly obtained from the bonding process to form desired circuit patterns to receive semiconductor dice (step 308). The bonded substrate assembly may be sliced into a plurality of DAB substrates for use in manufacturing power devices, where the slicing step may be performed before or after the patterning step. Generally, each power device is provided with one DAB substrate. In one embodiment, the power device is a discrete device and includes only one semiconductor die.

The bonded substrate assembly is patterned using an etch process according to one embodiment of the present invention. In one embodiment, the etch process is performed using the base of $FeCl_3$ chemistry or $CuCl_2$ chemistry that are used in an etch process for patterning a direct bonded copper (DCB) substrate. This type of etch process is used in order to combine the manufacturing of DCB and DAB substrates in the same production line, so that the need for re-tooling the equipment for DAB etch process is avoided. Residues of AlSi alloy remaining on the aluminum substrates after the etch or patterning step is removed by an nitric acid etchant (containing hydrofluoric and acetic acid), which has a high AlSi alloy etch selectivity, i.e., Al is not easily etched.

Next, the DAB substrate under goes a preferably selective electroless Ni- or Ni-/Au-plating process to prepare the DAB substrate or the bonded substrate assembly to adapt it to be suitably solderable (step 310). The plating is performed in the present embodiment because Al generally does not effectively wet conventional soft solders. Good solderability facilitates the use of the DAB substrate in electronic devices. Generally, the plating process is performed after zincate pre-treatment of the surface of the aluminum substrate. The phosphorous content of the nickel layer is about 6% to about 10%, preferably about 8%. In one embodiment, the thickness of the nickel layer formed has about 3 $\mu$m to about 8 $\mu$m, preferably about 5 $\mu$m. That is, the nickel layer is sufficiently thick enough to prevent solder penetration to the Ni—Al interface during the soldering process. Otherwise, the solder may not probably wet the contacting Al surface.

Another embodiment of the present invention relates to stress relief techniques performed on the metal plate, e.g., aluminum substrate, to be bonded to the ceramic in order to reduce mechanism failure from mechanical stress induced by severe temperature changes, explained above. In one implementation, the stress relief technique involves shaping the geometry of the edges of the metal layer to be bonded to the ceramic layer. Alternatively, the shaping may be performed during the patterning step after the bonding step, as with other stress relief techniques described herein.

Figure 12:
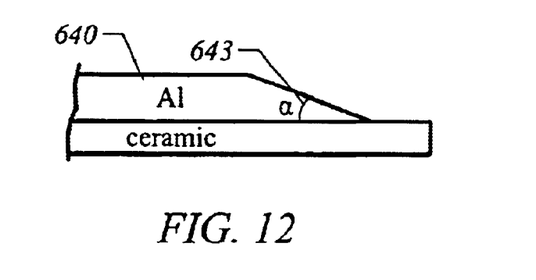
FIG. 12 illustrates a sloping edge of an aluminum layer of a direct bonded aluminum substrate that is provided to enhance stress-handling characteristics according to one embodiment of the present invention.

In one embodiment, the edges of the metal layer 640 are provided with a grading slope 643 of degrees "α" (FIG. 12) that is smaller than 90 degrees. In one implementation, the slope 643 has a degree between about 30 degrees to about 60 degrees.

Figure 14:
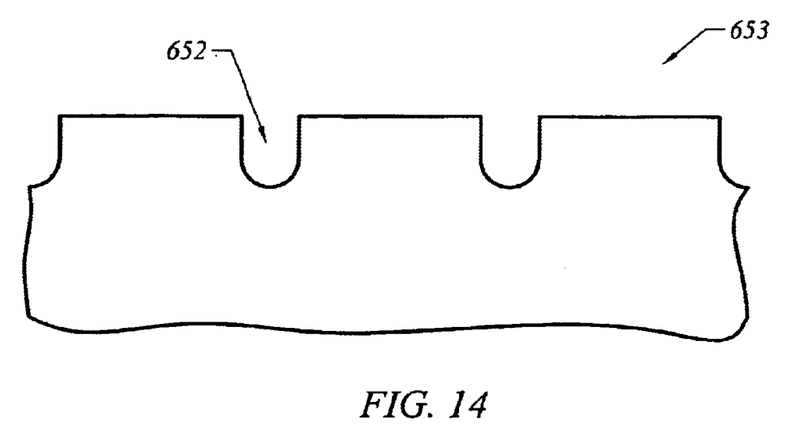
FIGS. 14 and 15 illustrate, respectively, an enlarged view of an edge portion of the direct bonded metal substrate of FIG. 13.

In another embodiment, the metal layer is etched to provide a plurality of notches, holes, grooves, or bays at the edges of a metal substrate. FIG. 13 shows a metal substrate 650 including a plurality of notches 652 at edges thereof and a ceramic substrate 654 provided therebeneath. FIG. 14 shows an enlarged view of an edge portion 653 of the metal substrate 650 wherein the notches 652 are provided. In one embodiment, the notches 652 have a pitch of 0.8 mm, a width of 0.2 mm, and a depth of 0.25 mm.

Figure 15:
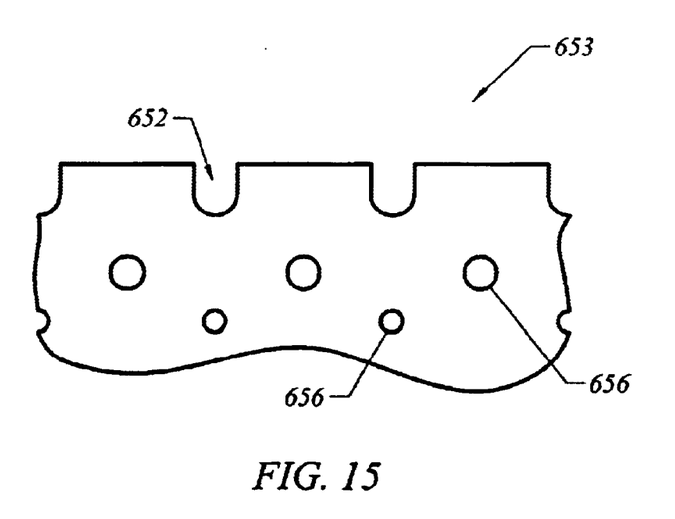

Referring to FIG. 15, in another embodiment, the edge portion 653 includes a combination of variously-shaped notches along the edges of the metal layer 650 and having a sloping edge. In yet another embodiment, a plurality of holes 656 of various shapes and diameters (e.g., 0.15 mm or 0.1 mm) are etched in the metal layer for stress relief, i.e., to enhance stress-handling characteristics. The holes will cover the edge area up to a distance d (typically up to about 1 mm, depending on metal thickness) from the area of the edge with said notches. The combination of circular holes and notches, as an example of one of many possibilities in achieving the desired stress relief pattern. The present stress relief techniques may be applied to various metal layers or substrates (e.g., aluminum or copper) used in forming a direct bonded metal substrates.

While the invention has been particularly shown and described with reference to a specific embodiment thereof, it will be understood by those skilled in the art that the foregoing and other changes in the form and details may be made therein without departing from the spirit or scope of the invention. Therefore, the scope of this invention should not be limited to the embodiments described above, and should instead be defined by the following claims.

What is claimed is:

1. A method for manufacturing a power semiconductor device, comprising:

inserting a substrate assembly into a furnace having a plurality of process zones, the substrate assembly including a first aluminum layer and a second aluminum layer that are electrically isolated from each other by a dielectric layer;

providing the substrate assembly successively into each of the plurality of process zones to bond the first and second aluminum layers to the dielectric layer and obtain a direct bonded aluminum (DAB) substrate;

attaching a semiconductor die to the first aluminum layer of the DAB substrate; and forming an enclosure around the semiconductor die and the DAB substrate while exposing a substantial portion of the second aluminum layer for enhanced heat dissipation.

2. The method of claim 1, wherein the second aluminum layer is flushed to a backside of the enclosure.

3. The method of claim 1, wherein the plurality of process zones includes a preheating zone, a bonding zone, and a cooling zone, wherein the bonding zone is provided with an inert gas to facilitate the bonding of the aluminum layers to the dielectric layer without providing a vacuum environment.

4. The method of claim 1, further comprising:

shaping an edge of at least one of the aluminum layers to enhance stress-handling characteristics of the DAB substrate.

5. The method of claim 4, wherein the shaping step is performed prior to the bonding of the at least one of the aluminum layers to the dielectric layer.

6. The method of claim 4, wherein the shaping is performed on all outer edges of the at least one of the aluminum layers.

7. The method of claim 4, wherein the shaping step includes:
providing a slope to the edge of the at least one of the aluminum layers, the slope having an angle of about 30 degrees to about 60 degrees; and
forming a plurality of notches, holes, or grooves on the edge of the at least one of the aluminum layers.

8. The method of claim 1 wherein the first aluminum layer and the second aluminum layer are each coated by an Al—Si alloy or an Al—Mg alloy opposing to the dielectric layer.

9. A method for forming a direct bonded metal substrate for use in a power semiconductor device, the method comprising:
inserting a substrate assembly into a furnace having a plurality of process zones, the substrate assembly including a first aluminum substrate and a second aluminum substrate that are electrically isolated from each other by a dielectric substrate; and
providing the substrate assembly successively into each of the plurality of process zones to bond the first and second aluminum substrates to the dielectric substrate at the same time, thereby obtaining a direct bonded aluminum (DAB) substrate.

10. The method of claim 9, wherein the plurality of process zones includes a preheating zone, a bonding zone, and a cooling zone, wherein the bonding zone is provided with an inert gas to facilitate the bonding of the aluminum substrates to the dielectric substrate without providing a vacuum environment.

11. The method of claim 9, further comprising:
shaping an edge of at least one of the aluminum substrates to enhance stress-handling characteristics of the DAB substrate.

12. The method of claim 11, wherein the shaping step is performed prior to the bonding of the aluminum substrates to the dielectric substrate.

13. The method of claim 11, wherein the shaping is performed on all outer edges of the one of the aluminum substrates.

14. The method of claim 11, wherein the shaping step includes:
providing a slope to the edge of the one of the aluminum substrates, the slope having an angle of about 30 degrees to about 60 degrees; and
forming a plurality of notches, holes, or grooves on the edge of the one of the aluminum substrates.

15. The method of claim 9, further comprising:
placing a top boat over the substrate assembly to apply a pressure to facilitate the bonding of at least the first aluminum substrate to the dielectric substrate;
providing a bottom boat below the substrate assembly, wherein the top boat is heavier than the bottom boat.

16. The method of claim 15, further comprising:
providing an aluminum-silicon alloy layer on a surface of the first aluminum substrate facing the dielectric substrate to facilitate the bonding between the first aluminum substrate and the dielectric substrate.

17. The method of claim 9 wherein the first aluminum substrate and the second aluminum substrate are each coated by an Al—Si alloy or an Al—Mg alloy opposing to the dielectric layer.

* * * * *